(12) United States Patent
Abadie et al.

(10) Patent No.: US 11,519,949 B2
(45) Date of Patent: Dec. 6, 2022

(54) MEASUREMENT SYSTEM AND METHOD OF PERFORMING AN OVER-THE-AIR TEST

(71) Applicant: Rohde & Schwarz GmbH & Co. KG, Munich (DE)

(72) Inventors: Vincent Abadie, Munich (DE); Ramez Khoury, Munich (DE); Corbett Rowell, Munich (DE); Jose Fortes, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 237 days.

(21) Appl. No.: 16/913,113

(22) Filed: Jun. 26, 2020

(65) Prior Publication Data

US 2021/0148958 A1    May 20, 2021

(30) Foreign Application Priority Data

Nov. 14, 2019  (EP) .................................... 19209229

(51) Int. Cl.
*G01R 29/08*    (2006.01)
*G01R 29/10*    (2006.01)

(52) U.S. Cl.
CPC ..... *G01R 29/0871* (2013.01); *G01R 29/0878* (2013.01); *G01R 29/105* (2013.01)

(58) Field of Classification Search
CPC ............ G01R 29/0871; G01R 29/0878; G01R 29/105; H04B 17/382
(Continued)

(56) References Cited

U.S. PATENT DOCUMENTS 10,677,832 B2 *   6/2020  Abadie ................. G01R 29/10
2010/0039332 A1   2/2010  Dybdal et al.
(Continued)

FOREIGN PATENT DOCUMENTS

EP    3276362 A1    1/2018
EP    3546958 A1    10/2019
WO    2012/089892 A1    7/2012

OTHER PUBLICATIONS

Keysight Technologies, "TP to 38.810: Rationale behind IFF1 (CATR)", 3GPP TSG-RAN4 Meeting RAN4#86, Athens, Greece, Mar. 2018, 17 pages.
(Continued)

*Primary Examiner* — Tan H Trinh
(74) *Attorney, Agent, or Firm* — Christensen O'Connor Johnson Kindness PLLC

(57) ABSTRACT

The present disclosure relates to a measurement system for testing a device under test over-the-air. The measurement system comprises a signal generation and/or analysis equipment, several antennas, several reflectors and a test location for the device under test. The antennas are connected with the signal generation and/or analysis equipment in a signal-transmitting manner Each of the antennas is configured to transmit and/or receive an electromagnetic signal so that a beam path is provided between the respective antenna and the test location. The electromagnetic signal is reflected by one of the reflectors so that the electromagnetic signal corresponds to a planar wave, thereby providing indirect far field conditions for testing. A first reflector of the several reflectors is orientated at a first azimuth angle and at a first elevation angle with respect to a center of the test location. A second reflector of the several reflectors is orientated at a second azimuth angle and at a second elevation angle with respect to the center of the test location. The second elevation angle is different to the first elevation angle. The second
(Continued)

azimuth angle is different to the first azimuth angle. Further, a method of performing an over-the-air test of a device under test is described.

19 Claims, 2 Drawing Sheets

(58) Field of Classification Search
USPC .......................................... 455/517; 343/703
See application file for complete search history.

(56) References Cited

U.S. PATENT DOCUMENTS

| | | | |
|---|---|---|---|
| 2013/0210474 A1* | 8/2013 | Kyosti | H04B 17/364 455/517 |
| 2015/0116164 A1* | 4/2015 | Mannion | G01R 31/001 343/703 |
| 2018/0034559 A1* | 2/2018 | Foegelle | H04W 72/042 |
| 2018/0034560 A1* | 2/2018 | Foegelle | H04B 17/0085 |
| 2018/0294896 A1* | 10/2018 | Foegelle | H04B 17/364 |
| 2018/0340968 A1* | 11/2018 | Abadie | G01R 29/10 |
| 2019/0101579 A1* | 4/2019 | Rowell | H04B 17/0085 |
| 2019/0302184 A1* | 10/2019 | Rowell | G01R 29/0821 |
| 2020/0099458 A1* | 3/2020 | Leather | H04W 24/08 |

OTHER PUBLICATIONS

Farabakhsh, A., et al., "Analysis and Design of Metallic Parabolic Anechoic Chamber," 11th European Conference on Antennas and Propagation (EUCAP), pp. 3053-3056, Mar. 19, 2017.

* cited by examiner

MEASUREMENT SYSTEM AND METHOD OF PERFORMING AN OVER-THE-AIR TEST

FIELD OF THE DISCLOSURE

The present disclosure generally relates to a measurement system for testing a device under test over-the-air (OTA). Further, the present disclosure relates to a method of performing an over-the-air test of a device under test.

BACKGROUND

In the state of the art, measurement systems are known for testing a device under test with regard to its over-the-air characteristics (OTA characteristics). The device under test typically relates to a communication device that uses modern telecommunication standards for communicating with another communication device, for instance a mobile device or a user equipment (UE). However, the device under test may also relate to a base station (BS).

For testing the device under test, at least one antenna is directed towards the device under test to be tested by the measurement system wherein the antenna is located in the far-field of the device under test. Hence, it is ensured that the far-field characteristics of the device under test can be tested in an appropriate manner. It is also known to use multiple measurement antennas that are located in the far-field in order to test the far-field characteristics of the device under test in a more accurate manner.

Modern communication devices, particularly mobile phones, operate at millimeter waves (mmWave) while using directive beam steered antennas. Hence, the respective communication device, for instance a mmWave base station or a mmWave user equipment, deploys a directive antenna system that significantly reduces the observed channel power angular spectrum (PAS) and/or the total angular spread (AS).

It is known to use measurement systems in the respective far-field distance (FFD) in order to emulate respective channel models for testing the over-the-air characteristics of the device under in order to obtain reliable test results as well as acceptable measurement uncertainties. In fact, three-dimensional geometry-based stochastic channel models (GSCM) have been specified for mmWave bands that are used to emulate the respective channel(s) at the device under test.

However, the measurement systems known in the state of the art require a large volume due to the type of electromagnetic signals used for testing, namely mmWave signals. In fact, a measurement system being larger than 10 m is required for generating a test zone with a diameter of 20 cm when using the respective electromagnetic signals.

Accordingly, there is a need to provide a compact measurement system that ensures reliable test results.

SUMMARY

The present disclosure provides examples of a measurement system for testing a device under test over-the-air. In an embodiment, the measurement system comprises a signal generation and/or analysis equipment (e.g., circuits, etc.), several antennas, several reflectors and a test location for the device under test. The antennas are connected with the signal generation and/or analysis equipment in a signal-transmitting manner Each of the antennas is configured to transmit and/or receive an electromagnetic signal so that a beam path is provided between the respective antenna and the test location. The electromagnetic signal is reflected by one of the reflectors so that the electromagnetic signal corresponds to a planar wave, thereby providing indirect far-field conditions for testing. A first reflector of the several reflectors is orientated at a first azimuth angle and at a first elevation angle with respect to a center of the test location. A second reflector of the several reflectors is orientated at a second azimuth angle and at a second elevation angle with respect to the center of the test location. The second elevation angle is different to the first elevation angle. The second azimuth angle is different to the first azimuth angle.

Further, the present disclosure provides examples of a method of performing an over-the-air test of a device under test. In an embodiment, the method comprises the steps of:

Providing a measurement system for testing the device under test over-the-air, wherein the measurement system comprises several antennas as well as several reflectors orientated towards a test location for the device under test. Each antenna is assigned to at least one respective reflector such that a beam path is provided between the respective antenna and the test location. Each antenna and the corresponding reflector together provide a corresponding quite zone at the test location.

Orientating a first reflector of the several reflectors at a first azimuth angle and at a first elevation angle with respect to a center of the test location.

Orientating a second reflector of the several reflectors at a second azimuth angle and at a second elevation angle with respect to the center of the test location, wherein the second elevation angle is different to the first elevation angle, and wherein the second azimuth angle is different to the first azimuth angle.

Positioning the device under test at the test location.

Using the first reflector and the corresponding antenna as well as the second reflector and the corresponding antenna for radio frequency measurements. The electromagnetic signals are reflected by the first and second reflectors so that the electromagnetic signals correspond to planar waves, thereby providing indirect far-field conditions for testing.

The present disclosure provides a measurement system that corresponds to a compact antenna test range (CATR) that provides an indirect far-field (IFF) test zone or rather quite zone for testing the device under test. The indirect far-field test zone is (substantially) independent of the frequency used by the electromagnetic signals for testing. This is not the case for direct far-field (DFF) quite zones since the respective test volume depends on the frequency in the DFF approach. This means that the respective test volume decreases with an increasing frequency of the electromagnetic signals used for testing.

In contrast to direct far-field measurement systems, the distance between the antenna and the corresponding reflector can be set such that any influence of the frequency used by the electromagnetic signals on the test volume can be compensated appropriately.

Moreover, the measurement system corresponds to a three-dimensional channel model emulation test system that is realized by a compact antenna test range (CATR). In other words, a compact antenna test range (CATR) is extended for three-dimensional spatial channel model emulation.

The respective reflectors are positioned and/or orientated with respect to the center of the test location, for example a testing plane associated with the test location, in a certain manner, thereby ensuring the three-dimensional spatial channel model emulation. In some embodiments, at least two of the several reflectors are located at different azimuth and elevation angles with respect to the center of the test location.

The elevation angle is measured from the center of the test location within the testing plane that relates to a horizontal plane, for instance a surface of a table board, which may be parallel to a floor.

The azimuth angles are also orientated with respect to the center of the test location, wherein the center is associated with a center axis that is perpendicular to the testing plane. Accordingly, the first and the second reflectors having different azimuth angles are located at different angular positions concerning a projection of them on the testing plane due to the different azimuth angles.

In general, the reflector positions in the measurement system are optimized to emulate the azimuth and elevation angles according to the respective (three-dimensional/spatial) channel model such that a required power angular spectrum (PAS) can be reproduced in the test zone, namely at the respective test location.

For instance, the reflector positions in the measurement system are optimized to emulate the azimuth and elevation of the channel model impinging angles. In some embodiments, the reflectors are placed in a three-dimensional setup, wherein the reflectors, for example the first and the second reflectors, vary concerning their respective azimuth and elevation angles relative to the center of the test zone, namely the test location, in order to accurately reproduce the three-dimensional power angular spectrum of the channel model.

In some embodiments, the three-dimensional setup includes, for example, one or more controllable linear and/or angular position stages or tables suitable controlled by one or more control signals. The one or more linear and/or angular position stages or tables are configured to position the first and/or second reflectors in any position set forth herein.

The respective measurements may be performed in the frequency range associated with 5G-1-R2, namely the Frequency Range 2 (FR2) of the 5G telecommunication standard.

The respective reflectors may be located in an equidistant manner with respect to the center of the test location, for example the device under test placed at the test location. However, the reflectors may also be located in a non-equidistant manner from the device under test. In some embodiments, any path loss (attenuation) can be emulated by the measurement system since the path loss depends on focal length rather than the distance between the device under test and the reflector.

An aspect provides that the first reflector and that the second reflector are located at different heights with respect to a testing plane associated with the test location such that the first and second reflectors are located in different planes that are parallel to the testing plane. Since the first and the second reflectors are associated with different elevation angles, the respective reflectors may be positioned at different heights compared to the testing plane. Accordingly, the first and second reflectors are located at different positions, for example different heights, in the three-dimensional spatial testing grid that is used for testing the device under test with regard to the spatial channel model for the mmWave bands.

In some embodiments, the several reflectors are located on a three-dimensional sphere located around the test location. The respective reflectors may be located on a common sphere even though at least two of the reflectors are associated with different azimuth angles as well as different elevation angles. Nevertheless, the first and the second reflectors are associated to a common testing sphere that surrounds the test location, for example the center of the test location.

For instance, all of the several reflectors are located at different azimuth angles. Thus, each of the reflectors is located at a different angular orientation with respect to the center of the test location, for example in a projection of the reflectors on the testing plane.

Another aspect provides that at least three reflectors are provided, wherein a third reflector of the at least three reflectors is orientated at the first elevation angle with respect to the center. Accordingly, two of the at least three reflectors are orientated at the same elevation angle that is different to the second elevation angle associated with the second reflector. Put differently, at least two of the at least three reflectors, namely the first reflector and the third reflector, may be located at the same height with respect to the testing plane, which is different to the height associated with the second reflector.

In some embodiments, the third reflector can be positioned by, for example, one or more controllable linear and/or angular position stages or tables suitable controlled by one or more control signals. The one or more linear and/or angular position stages or tables are configured to position the third reflector in any position set forth herein.

The measurement system may comprise an anechoic chamber, wherein the several antennas, the several reflectors and the test location are located in the anechoic chamber. The anechoic chamber ensures that no interfering signals interact with the electromagnetic signals used for testing, for example any signals that may disturb the testing of the device under test. The measurement uncertainty can be reduced accordingly.

Moreover, the electromagnetic signal may be reflected by more than one reflector such that two or more reflectors are located in the beam path between the corresponding antenna and the test location, thereby generating a large probe distance. The measurement system is enabled to test high frequencies that usually require large distances between the antenna and the test location in direct far-field setups. However, the measurement system ensures that those measurements can be performed in an indirect manner by reflecting the respective electromagnetic signals at least twice due to two or more reflectors located within the single beam path established between the test location and the corresponding antenna.

Another aspect provides that at least two antennas are associated with a single reflector. The at least two antennas may be located in the focal point of the single reflector. The respective antennas may be controlled simultaneously or in a subsequent manner Thus, a small angular spacing can be emulated since two antennas are orientated towards the same reflector such that they interact with the single reflector.

In some embodiments, the measurement system, for instance the signal generation and/or analysis equipment, is configured to adjust a downlink power of at least one of the antennas associated with the single reflector in order to compensate for varying path loss between the antennas. In some embodiments, the downlink power of the electromagnetic signal is adjusted which is transmitted by the respective antenna.

The single reflector may be larger (compared with other reflectors) if necessary in order to provide the same test volume, namely the same volume of the quite zone.

Another aspect provides that at least one of the antennas associated with the single reflector is located offset from the focal point of the single reflector. Hence, a small angular spacing can be generated. Furthermore, both antennas may be located offset from the focal point of the single reflector, thereby ensuring a larger small angular spacing compared to the embodiment in which only one of both antennas is located offset. However, this angular spacing is still smaller than an angular spacing provided by two neighbored or rather separate reflectors.

For instance, the at least one (feed) antenna deviates from the focal point by 2 to 5 degrees.

The at least two antennas located offset from the focal point may deviate from each other by 5 to 10 degrees.

Further, a multipath fading simulator may be provided that is configured to emulate multiple radio frequency (RF) paths, for example to emulate a fading of the signals in the respective RF paths. Accordingly, multiple antennas may be controlled simultaneously in order to transmit and/or receive electromagnetic signals via the respective radio frequency paths emulated.

In addition, a subset of the several antennas can be controlled by the multipath fading simulator such that a fading of certain signals associated with dedicated channels is simulated accordingly.

The multipath fading simulator may have at least six radio frequency paths. Two radio frequency paths may be associated with a single antenna, wherein the radio frequency paths correspond to a reception path and a transmission path which are associated with the dedicated antenna.

The measurement system may be configured to emulate spatial fading conditions. Accordingly, the three-dimensional spatial channel model may be emulated by the measurement system. In some embodiments, the several antennas together with the several reflectors emulate the spatial fading conditions while being controlled appropriately by the signal generation and/or analysis equipment.

Moreover, a base station simulator may be provided. The signal generation and/or analysis equipment may be configured to simulate the base station for interacting with the device under test. The device under test may relate to a user equipment (UE). Hence, the communication between the user equipment and the base station may be tested by the measurement system while simulating the base station. In some embodiments, a communication according to the channel model is emulated between the simulated base station and the device under test established by the user equipment.

Another aspect provides that the measurement system comprises a positioner for the device under test that is assigned to the test location. Therefore, the device under test may be located on the positioner such that the device under test can be positioned in a controlled and an appropriate manner during the testing.

In some embodiments, the positioner is a three-dimensional positioner (e.g., 3D stage or table, etc.) that is configured to move the device under test at the test location in three dimensions. Therefore, the spatial characteristics of the device under test can be tested in an appropriate manner.

Furthermore, each antenna and the corresponding reflector together may be configured to provide a corresponding quite zone at the test location. The respective quite zones generated superimpose with each other at the test location, resulting in a common quite zone for testing purposes, which is also called test zone.

Another aspect provides that spatial fading conditions may be emulated by the measurement system. The signal generation and/or analysis equipment generates electromagnetic signals with respective properties such that the spatial fading conditions for testing are ensured.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
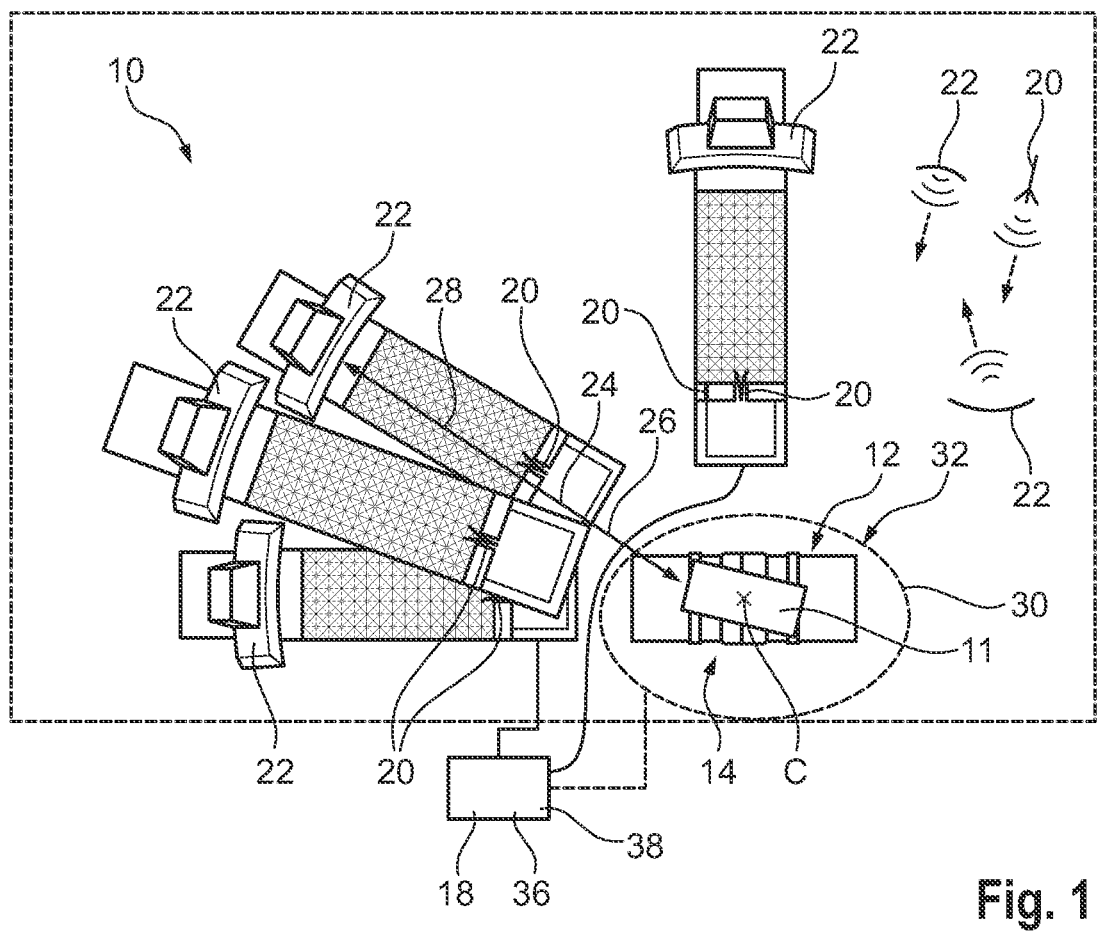
FIG. 1 shows a top view on a measurement system according to an embodiment of the present disclosure.

In FIG. 1, a measurement system 10 is shown that is used for testing a device under test 11 over-the-air, which is also abbreviated by DUT. The device under test 11 is located on a test location 12 that is assigned to a positioner 14 of the measurement system 10 for positioning the device under test 11 during the testing.

The positioner 14 may be established by a rotary positioner configured to rotate the device under test 11 in a plane around an axis of rotation. Alternatively, the positioner 14 may be established as a three-dimensional (3D) positioner that ensures a three-dimensional movement of the device under test 11 at the test location 12.

The measurement system 10 also comprises an anechoic chamber 16 that encompasses the test location 12 in order to shield an inner space from the environment such that no interfering signals disturb the testing. Furthermore, the measurement system 10 has a signal generation and/or analysis equipment (e.g., one or more circuits) 18 which may be located within the anechoic chamber 16 or outside thereof.

The signal generation and/or analysis equipment 18 is connected with the positioner 14 as illustrated by the dashed line in FIG. 1. Accordingly, the signal generation and/or analysis equipment 18 is enabled to control positioning of the device under test 11 via the positioner 14 during the testing of the device under test 11. The signal generation and/or analysis equipment 18 outputs respective control signals that are processed by the positioner 14 appropriately in order to move the device under test 11 in a controlled manner during the testing.

In addition, the signal generation and/or analysis equipment 18 is connected with several antennas 20 in a signal-transmitting manner. Accordingly, the measurement system 10 is generally enabled to forward signals received by the respective antennas 20 to the signal generation and/or analysis equipment 18 for analyzing purposes. Further, signals to be emitted are forwarded to the antennas 20 via the signal generation and/or analysis equipment 18. Hence, the antennas 20 may relate to feed antennas.

The signal generation and/or analysis equipment 18 may comprise a signal generation circuit or means, for instance a so-called automotive radar echo generator ("AREG"), as well as a controlling circuit or platform, for instance an open switch and control platform ("OSP"). In some embodiments, each antenna 20 may be assigned to its own signal generation means, namely its own AREG. Thus, each antenna 20 may receive a respectively generated electromagnetic signal to be emitted.

In any case, the signals to be emitted are generated by the signal generation the signal generation and/or analysis equipment 18 and routed to the corresponding antennas 20 for being emitted towards the device under test 11 that is located at the test location 12.

The measurement system 10 further comprises several reflectors 22 that are assigned to the antennas 20. The reflectors 22 may be shaped. For instance, the reflectors 22 are parabolic reflectors.

Accordingly, each of the reflectors 22 is assigned to at least one corresponding antenna 20 such that the respective antenna 20 and the corresponding reflector 22 together establish a pair.

Generally, a beam path 24 is provided between the respective antenna 20 and the test location 12 along which the electromagnetic signals propagate. The electromagnetic signals may originate from the antenna 20 such that the signals are reflected by the corresponding reflector 22 in order to be received at the test location 12 by the device under test 11.

Alternatively, the electromagnetic signals may originate from the test location 12, namely the device under test 11 located at the test location 12, while being reflected by the reflector 22 towards the corresponding antenna 20 that receives the electromagnetic signal accordingly. The signals received are forwarded to the signal generation and/or analysis equipment 18 for analyzing purposes.

One of the several beam paths 24 provided by the respective pairs is schematically shown in FIG. 1 by a line. The beam path 24 comprises a first section 26 located between the test location 12 and the reflector 22 as well as a second section 28 established between the reflector 22 and the corresponding antenna 20.

The electromagnetic signals are reflected by the respective reflector 22 irrespective of the fact from where the electromagnetic signal originates as described above.

Accordingly, the electromagnetic signals may originate from the device under test 11 located at the test location 12 or rather the respective antenna 20. This depends on the respective testing mode enabled, namely whether the receiving characteristics or rather the transmitting characteristics of the device under test 11 shall be investigated.

In any case, it is ensured (due to the beam path 24 provided) that the electromagnetic signal corresponds to a planar wave at the test location 12 or rather the respective antenna 20. Accordingly, indirect far-field (IFF) conditions are ensured for testing purposes.

The electromagnetic signals emitted by the antennas 20 impinge on the reflectors 22 after having travelled along the second section 28 of the respective beam paths 24. The respective reflectors 22 reflect the electromagnetic signals originating from the antennas 20 towards the test location 12 such that plane waves are received by the device under test 11 located at the test location 12. Hence, the electromagnetic signals travel along the first section 26 and the second section 28 of the beam path 24.

As mentioned above, the measurement system 10 is configured to test the far-field characteristics of the device under test 11 even though the distance between the respective antennas 20 and the test location 12 is small, namely lower than the Fraunhofer distance. Accordingly, each antenna 20 and the corresponding reflector 22 together, namely the respective pairs, provide a dedicated quite zone 30 at the test location 12, which ensures that the far-field characteristics of the device under test 11 can be tested accurately at the test location 12.

The respective quite zones 30 provided by the different pairs may superimpose with each other, resulting in a test zone 32 encompassing the test location 12. However, the test zone 32 may also correspond to a single quiet zone provided that only one antenna 20 is active during the respective testing. This may depend on the test scenario applied.

In general, the measurement system 10 corresponds to a so-called compact antenna test range (CATR) since the measurement system 10 ensures plane wave exposure of the device under test 11 at the test location 12 or rather within the respective quite zones 30, namely within the test zone 32.

The measurement system 10 is further configured to emulate a three-dimensional spatial channel model. Hence, the measurement system 10 corresponds to a three-dimensional channel model emulation test system, for example a compact antenna test range (CATR) that is extended for three-dimensional spatial channel model emulation.

The several reflectors 22 are located with respect to a center C of the test location 12 within a test plane T of the measurement system 10 in a certain manner in order to ensure the three-dimensional spatial channel model emulation.

The test plane T is parallel to a horizontal plane. In the top view on the measurement system 10 that is illustrated in FIG. 1, the test plane T corresponds to the respective plane of projection or rather drawing plane.

As shown in the top view illustrated in FIG. 1, the several reflectors 22 are each located at different azimuth angles with respect to the center C of the test location 12, which is associated with a center axis that is perpendicular to the test plane T.

Hence, the respective reflectors 22 are each located at different angular positions with respect to the center C of the test location 12, namely concerning a projection on the test plane T as illustrated in FIG. 1.

Furthermore, FIG. 1 already illustrates that the reflectors 22 are also located at different elevation angles with respect to the center C.

Figure 2:
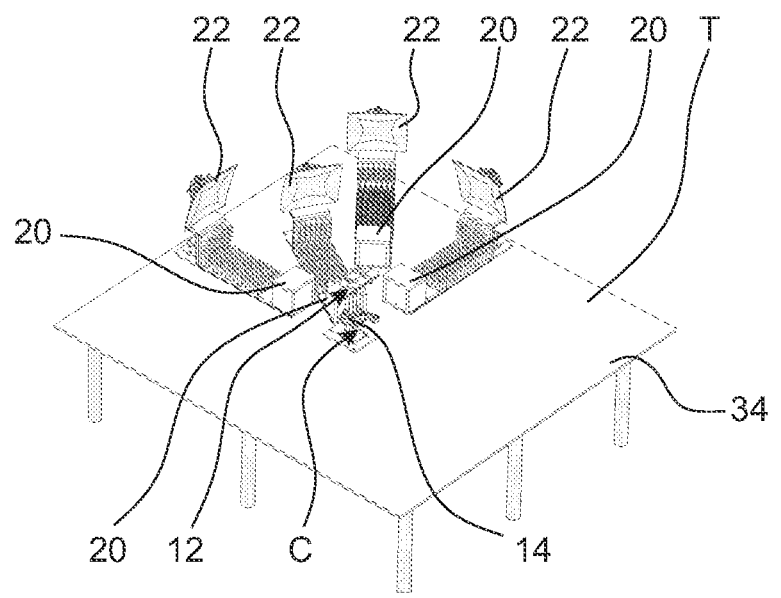
FIG. 2 shows a side view on a measurement system according to an embodiment of the present disclosure.
Figure 3:
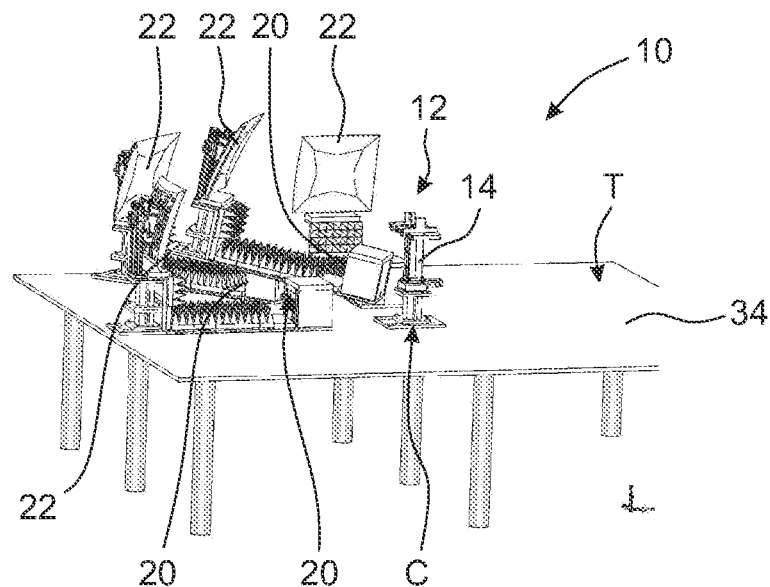
FIG. 3 shows another side view of the measurement system according to FIG. 2.
Figure 4:
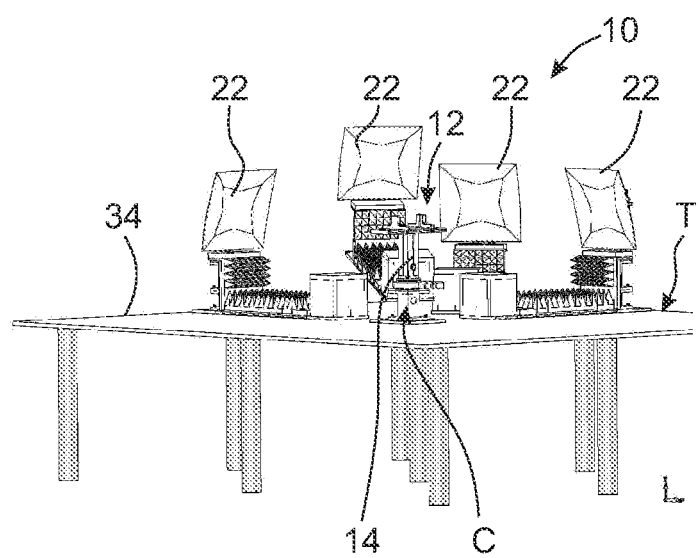
FIG. 4 shows another side view of the measurement system according to FIGS. 2 to 3.

This becomes more obvious when referring to FIGS. 2 to 4 showing a respective measurement system 10 in different side views, for example FIG. 4.

In FIGS. 2 to 4, the entire measurement system 10 (without the anechoic chamber 16) is illustrated on a table 34. The surface of the table board of the table 34 corresponds to the testing plane T.

It becomes obvious from FIGS. 2 to 4 that at least a second reflector 22 is orientated at a second elevation angle that is different to the first elevation angle of a first reflector 22 with respect to the center C.

Figure 5:
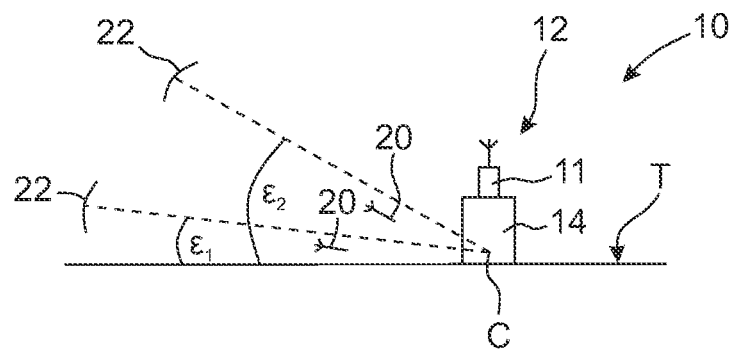
FIG. 5 schematically shows a side view of an embodiment of the measurement system according to the present disclosure for illustrating the concept of the measurement system.

Furthermore, this is illustrated in the schematic side view shown in FIG. 5 which illustrates the concept of the positions and/or orientations of the reflectors 22. In FIG. 5, the first elevation angle $\varepsilon_1$ associated with the first reflector 22 and the second elevation angle $\varepsilon_2$ associated with the second reflector 22 are illustrated.

Put differently, at least one of the several reflectors 22, namely the second reflector 22, is located at a different azimuth angle and at a different elevation angle with respect to the center axis C in comparison to at least one other of the reflectors 22, for instance the first reflector 22.

FIGS. 2 to 4 further illustrate that the other reflectors 22, namely all others than the second reflector 22, are orientated at the same elevation angle with respect to the center C of the test location 12, namely at the first elevation angle.

In the shown embodiment, the different elevation angles result in different heights of the respective reflectors 22 with respect to the testing plane T such that the first and second reflectors 22 are located in different planes that are parallel to the testing plane T. This is clearly shown in FIGS. 3 and 4.

In general, the respective reflectors 22 are located on a three-dimensional sphere located around the test location 12.

Hence, all reflectors 22 are located on a common sphere even though at least the second reflector 22 is located at a different azimuth angle and a different elevation angle compared to at least one other reflector 22, for instance the first reflector 22. An equidistant arrangement of the reflectors 22 is provided, which however is not necessary. In some embodiments, the several reflectors 22 may also be located in a non-equidistant manner with respect to the device under test 11.

In general, the measurement system 10 is enabled to emulate spatial fading conditions.

For this purpose, a multipath fading simulator circuit 36 is provided that is configured to emulate multiple radio frequency paths, for example spatial fading conditions of the radio frequency paths emulated, namely the respective channels.

The multipath fading simulator circuit 36 may be integrated in the signal generation and/or analysis equipment 18, for instance in a module-like manner. The multipath fading simulator circuit 36 may provide at least two radio frequency paths per antenna 20 such that the receiving characteristics as well as the transmitting characteristics of the device under test 11 can be investigated via each antenna 20 accordingly.

Furthermore, the signal generation and/or analysis equipment 18 is generally configured to simulate a base station. Therefore, a base station simulator circuit 38 is provided by the signal generation and/or analysis equipment 18.

Furthermore, the measurement system 10 may also provide a single beam path 24 in which more than one reflector 22, namely at least two reflectors 22 are located such that the electromagnetic waves or rather signals used for testing purposes are reflected at least twice. This is shown on the right side of FIG. 1. Accordingly, the overall travelling distance of the electromagnetic signals can be increased, thereby generating a large probe distance.

Moreover, at least two antennas 20 may be associated with a single reflector 22 which is also illustrated schematically in FIG. 1.

The at least two antennas 20 may be located in the focal point of the single reflector 22. Thus, very small angular characteristics can be investigated accordingly by using the respective antennas in a subsequent manner.

Furthermore, the antennas 20 may be located offset from the focal point of the single reflector 22, for instance by a few degrees, which is shown in FIG. 1.

An embodiment of the measurement system 10 may comprise three reflectors 22 and four antennas 20. Hence, two antennas 20 are associated with one single reflector 22, whereas the remaining two antennas 20 and the remaining two reflectors 22 establish two pairs.

Furthermore, the orientation and/or positions of the reflectors 22 may be set, for example in a controlled manner. In some embodiments, the reflectors 22 are positionable via one or more controllable linear and/or angular position stages or tables suitable controlled by one or more control signals. The one or more linear and/or angular position stages or tables are configured to position the reflectors in any position set forth herein.

Moreover, the distance between the antenna(s) 20 and the corresponding reflector(s) 22 may be adjustable, for example in a controlled manner Hence, the distance between the antenna(s) 20 and the corresponding reflector(s) 22 can be set in dependency of the electromagnetic signals used for testing purposes.

In any case, the measurement system 10 is configured to adjust a downlink power of at least one of the antennas 20 associated with the single reflector 22 such that a varying path loss between the antennas 20 can be compensated accordingly. The respective reflector 22 may be larger if necessary (compared to the other reflectors 22) in order to produce the same volume of the quite zone 30 at the test location 12.

In general, a compact measurement system 10 is provided, namely a compact antenna test range (CATR), which ensures three-dimensional channel module emulation while locating the respective reflectors 22 at different azimuth angles as well as different elevation angles.

Certain embodiments disclosed herein utilize circuitry (e.g., one or more circuits) in order to implement standards, protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes one or more processors or portions thereof and accompanying software, firmware, hardware, and the like.

In some examples, the methodologies and technologies described herein can be implemented by special purpose hardware-based computer systems or circuits, etc., or combinations of special purpose hardware and computer instructions.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A measurement system for testing a device under test over-the-air, comprising a signal generation and/or analysis equipment, several antennas, several reflectors and a test location for the device under test,
    wherein the antennas are connected with the signal generation and/or analysis equipment in a signal-transmitting manner,
    wherein each of the antennas is configured to transmit and/or receive an electromagnetic signal so that a beam path is provided between the respective antenna and the test location, the electromagnetic signal being reflected by one of the reflectors so that the electromagnetic signal corresponds to a planar wave, thereby providing indirect far field conditions for testing, and
    wherein a first reflector of the several reflectors is orientated at a first azimuth angle and at a first elevation angle with respect to a center of the test location, and a second reflector of the several reflectors being orientated at a second azimuth angle and at a second elevation angle with respect to the center of the test location, the second elevation angle being different to the first elevation angle, and the second azimuth angle being different to the first azimuth angle thereby ensuring that at least two of the several reflectors are located at different azimuth and elevation angles with respect to the center of the test location such that the first reflector and the second reflector are located at different angular positions concerning a projection of them on the testing plane due to the different azimuth angles as well as at different heights with respect to a testing plane associated with the test location due to the different elevation angles, and
    wherein a third reflector is orientated at the first elevation angle with respect to the center such that the first reflector and the third reflector are located at the same height with respect to the testing plane, which is different to the height associated with the second reflector.

2. The measurement system according to claim 1, wherein the first and second reflectors are located in different planes that are parallel to the testing plane.

3. The measurement system according to claim 1, wherein the several reflectors are located on a three-dimensional sphere located around the test location.

4. The measurement system according to claim 1, wherein all of the several reflectors are located at different azimuth angles.

5. The measurement system according to claim 1, wherein the measurement system comprises an anechoic chamber, and wherein the several antennas, the several reflectors and the test location are located in the anechoic chamber.

6. The measurement system according to claim 1, wherein the electromagnetic signal is reflected by more than one reflector such that two or more reflectors are located in the beam path between the corresponding antenna and the test location, thereby generating a large probe distance.

7. The measurement system according to claim 1, wherein at least two antennas are associated with a single reflector.

8. The measurement system according to claim 7, wherein the measurement system is configured to adjust a downlink power of at least one of the antennas associated with the single reflector in order to compensate for a varying path loss between the antennas.

9. The measurement system according to claim 7, wherein at least one of the antennas associated with the single reflector is located offset from the focal point of the single reflector.

10. The measurement system according to claim 1, wherein a multipath fading simulator is provided that is configured to emulate multiple radio frequency paths.

11. The measurement system according to claim 10, wherein the multipath fading simulator has at least six radio frequency paths.

12. The measurement system according to claim 1, wherein the measurement system is configured to emulate spatial fading conditions.

13. The measurement system according to claim 1, wherein a base station simulator is provided.

14. The measurement system according to claim 1, wherein a positioner for the device under test is provided that is assigned to the test location.

15. The measurement system according to claim 14, wherein the positioner is a three-dimensional positioner that is configured to move the device under test at the test location in three dimensions.

16. The measurement system according to claim 1, wherein each antenna and the corresponding reflector together are configured to provide a corresponding quiet zone at the test location.

17. A method of performing an over-the-air test of a device under test, with the following steps:
    providing a measurement system for testing the device under test over-the-air, wherein the measurement system comprises several antennas as well as several reflectors orientated towards a test location for the device under test, wherein each antenna is assigned to at least one respective reflector such that a beam path is provided between the respective antenna and the test location, and wherein each antenna and the corresponding reflector together provide a corresponding quiet zone at the test location;

orientating a first reflector of the several reflectors at a first azimuth angle and at a first elevation angle with respect to a center of the test location;

orientating a second reflector of the several reflectors at a second azimuth angle and at a second elevation angle with respect to the center of the test location, the second elevation angle being different to the first elevation angle, and the second azimuth angle being different to the first azimuth angle, thereby ensuring that at least two of the several reflectors are located at different azimuth and elevation angles with respect to the center of the test location such that the first reflector and the second reflector are located at different angular positions concerning a projection of them on the testing plane due to the different azimuth angles as well as at different heights with respect to a testing plane associated with the test location due to the different elevation angles, and wherein a third reflector is orientated at the first elevation angle with respect to the center such that the first reflector and the third reflector are located at the same height with respect to the testing plane, which is different to the height associated with the second reflector;

positioning the device under test at the test location; and using the first reflector and the corresponding antenna as well as the second reflector and the corresponding antenna for radio frequency measurements, the electromagnetic signals being reflected by the first and second reflectors so that the electromagnetic signals correspond to planar waves, thereby providing indirect far field conditions for testing.

18. The method according to claim 17, wherein spatial fading conditions are emulated by the measurement system.

19. A measurement system for testing a device under test over-the-air, comprising:

a signal generation and/or analysis equipment, several antennas, several reflectors and a test location for the device under test, wherein the antennas are connected with the signal generation and/or analysis equipment in a signal-transmitting manner, wherein each of the antennas is configured to transmit and/or receive an electromagnetic signal so that a beam path is provided between the respective antenna and the test location, the electromagnetic signal being reflected by one of the reflectors so that the electromagnetic signal corresponds to a planar wave, thereby providing indirect far field conditions for testing, and wherein a first reflector of the several reflectors is orientated at a first azimuth angle and at a first elevation angle with respect to a center of the test location, and a second reflector of the several reflectors being orientated at a second azimuth angle and at a second elevation angle with respect to the center of the test location, the second elevation angle being different to the first elevation angle, and the second azimuth angle being different to the first azimuth angle, wherein the measurement system is a three-dimensional channel model emulation test system that is enabled to emulate the azimuth and elevation angles according to a spatial channel model such that a required power angular spectrum (PAS) is reproduced at the respective test location.

* * * * *